(12) United States Patent
Park et al.

(10) Patent No.: US 12,317,729 B2
(45) Date of Patent: May 27, 2025

(54) ORGANIC LIGHT EMITTING DIODE DISPLAY DEVICE

(71) Applicant: LG Display Co., Ltd., Seoul (KR)

(72) Inventors: Je-Beom Park, Paju-si (KR); Ji-Su Yoon, Paju-si (KR); Dong-Ryul Jung, Paju-si (KR); Sung-Rae Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 533 days.

(21) Appl. No.: 17/337,171

(22) Filed: Jun. 2, 2021

(65) Prior Publication Data

US 2022/0037427 A1 Feb. 3, 2022

(30) Foreign Application Priority Data

Jul. 30, 2020 (KR) .................. 10-2020-0095098

(51) Int. Cl.
H10K 59/80 (2023.01)
H10K 59/35 (2023.01)
H10K 59/38 (2023.01)

(52) U.S. Cl.
CPC ....... H10K 59/8792 (2023.02); H10K 59/351 (2023.02); H10K 59/38 (2023.02)

(58) Field of Classification Search
CPC ... H01L 33/62; H01L 25/0753; H01L 27/322; H01L 27/3241–3279; H10K 59/12–1315
See application file for complete search history.

(56) References Cited

U.S. PATENT DOCUMENTS

| | | | |
|---|---|---|---|
| 10,510,810 B2 | 12/2019 | Kim et al. | |
| 2016/0087247 A1* | 3/2016 | Kim | H10K 50/813 |
| | | | 257/40 |
| 2018/0197921 A1* | 7/2018 | Kim | H10K 50/865 |
| 2020/0127057 A1* | 4/2020 | Yamashita | H10K 59/38 |

FOREIGN PATENT DOCUMENTS

| | | | | |
|---|---|---|---|---|
| JP | 2016021039 A | * | 2/2016 | |
| KR | 10-2014-0137740 A | | 12/2014 | |
| KR | 10-2015-0015274 A | | 2/2015 | |
| KR | 2016140089 A | * | 12/2016 | .......... G06F 3/0412 |
| KR | 20170010931 A | | 2/2017 | |
| KR | 20180082661 A | | 7/2018 | |
| KR | 10-2019-0069285 A | | 6/2019 | |
| KR | 10-2020-0015412 A | | 2/2020 | |
| KR | 20200080891 A | | 7/2020 | |

OTHER PUBLICATIONS

Machine translation of JP2016021039A, translated Oct. 13, 2023 (Year: 2016).*

* cited by examiner

*Primary Examiner* — Lauren R Bell
(74) *Attorney, Agent, or Firm* — Seed IP Law Group LLP

(57) ABSTRACT

An organic light emitting diode display device includes: a substrate including first to fourth subpixels each having an emission area and a non-emission area adjacent to the emission area; first to fourth light emitting diodes in the first to fourth subpixels, respectively, on the substrate; and a transmittance adjusting layer receiving a light emitted from the first to fourth light emitting diodes along a first direction and including a gray dye.

10 Claims, 8 Drawing Sheets

ORGANIC LIGHT EMITTING DIODE DISPLAY DEVICE

CROSS REFERENCE TO RELATED APPLICATIONS

The present application claims the priority benefit of Republic of Korea Patent Application No. 10-2020-0095098 filed in Republic of Korea on Jul. 30, 2020, which is hereby incorporated by reference in its entirety.

BACKGROUND

Technical Field

The present disclosure relates to an organic light emitting diode display device, and more particularly, to an organic light emitting diode display device having a relatively low reflectance and a relatively high luminance.

Description of the Related Art

Recently, with the advent of an information-oriented society and as the interest in information displays for processing and displaying a massive amount of information and the demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since the inner elements of the OLED display device have a solid phase, the OLED display device has high durability against an external impact and has a wide available temperature range.

In the OLED display device, since a contrast ratio is reduced due to a line or an electrode of a metal, a circular polarizer is disposed over a display panel to prevent reduction of a contrast ratio.

BRIEF SUMMARY

The inventors of the present disclosure have identified one or more problems in the related art. For example, in the OLED display device of the related art, the circular polarizer includes a retardation layer and a linear polarizing layer. The retardation layer includes a quarter wave plate (QWP) having a retardation value of $\lambda/4$, and the linear polarizing layer having a polarization axis linearly polarizes a light along the polarization axis.

When the retardation layer is disposed on the display panel and the linear polarizing layer is disposed on the retardation layer, an external light passes through the circular polarizer and is reflected in an inner portion of the display panel. Since the reflected light does not pass through the linear polarizing layer, an external light reflectance is reduced.

However, the inventors have recognized that when the circular polarizer is disposed on the display panel, a total luminance of the OLED display device is also reduced. For example, since a transmittance of the circular polarizer is within a range of about 40% to about 50%, a luminance of a light from a light emitting diode may be reduced over about 50% through the circular polarizer. As a result, the OLED display device has a limit in increase of luminance efficiency due to the circular polarizer having a transmittance of about 40% to about 50%.

The OLED display device is classified into a red, green, and blue independent emission type, a white emission type using red, green, and blue color filters and a color conversion type according to a method of obtaining a full color. When a white is displayed through the white emission type using red, green, and blue color filters, a white color transfer (WCT) is performed for an ideal white light.

The white color transfer is determined using a white subpixel, a blue subpixel and a green subpixel. Since the blue subpixel has a relatively low efficiency, a relatively high power consumption is required for the white color transfer.

In addition, a lifetime of a light emitting diode is reduced due to the blue subpixel having a relatively high power consumption, and an efficiency of the OLED display device is reduced.

Accordingly, one or more embodiments of the present disclosure provided by the inventors address one or more problems in the related art including the technical problems recognized above. One or more embodiments of the present disclosure is directed to an organic light emitting diode display device that substantially obviate one or more of the problems due to limitations and disadvantages of the related art.

One or more embodiments of the present disclosure provides an organic light emitting diode display device having a relatively low reflectance and a relatively high luminance.

One or more embodiments of the present disclosure provides an organic light emitting diode display device where a lifetime and an efficiency are improved and a power consumption is reduced.

One or more embodiments of the present disclosure provides an organic light emitting diode display device having an increased luminance and a decreased external light reflectance.

One or more embodiments of the present disclosure provides an organic light emitting diode display device wherein application products are enlarged and customer needs are satisfied.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages, as embodied and broadly described herein, an organic light emitting diode display device includes: a substrate including first, second, third and fourth subpixels each having an emission area and a non-emission area adjacent to the emission area; first, second, third and fourth light emitting diodes in the first, second, third and fourth subpixels, respectively, on the substrate; and a transmittance adjusting layer receiving a light emitted from the first, second, third and fourth light emitting diodes along a first direction and including a gray dye.

It is to be understood that both the foregoing general description and the following detailed description are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1A:
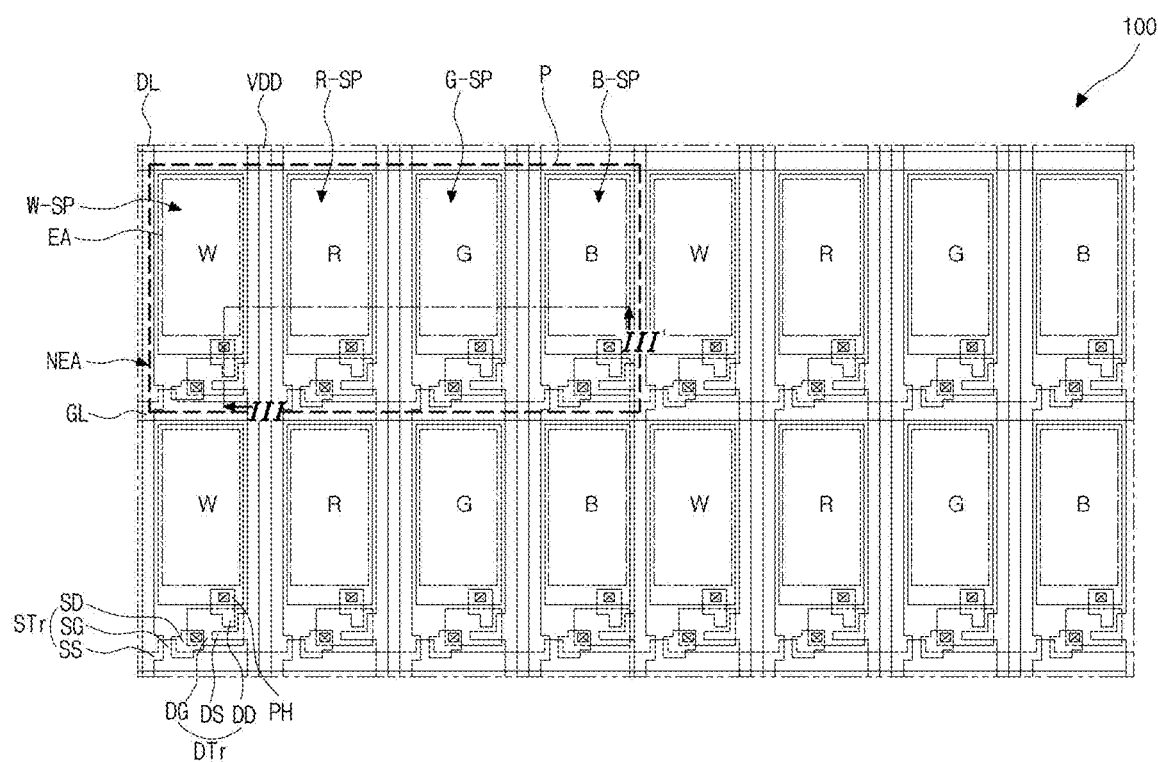
FIGS. 1A and 1B are a plan view and an exploded perspective view, respectively, showing an organic light emitting diode display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a display device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

Figure 1B:
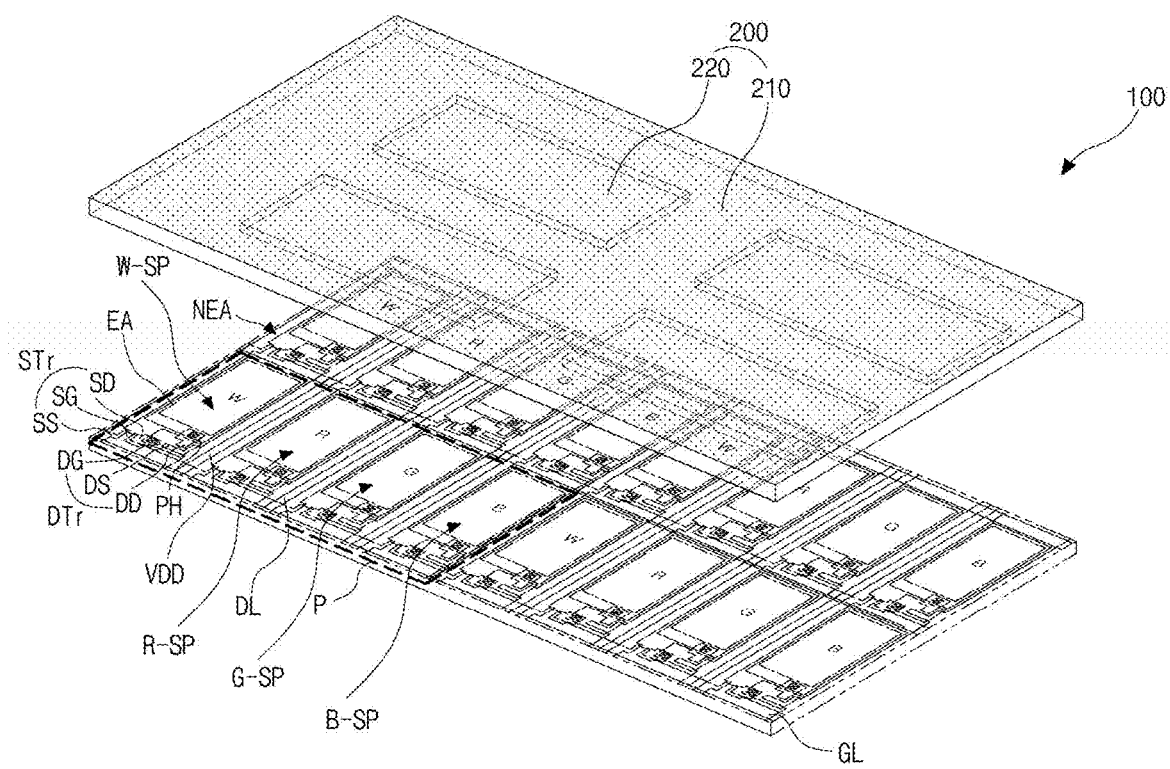
Figure 2:
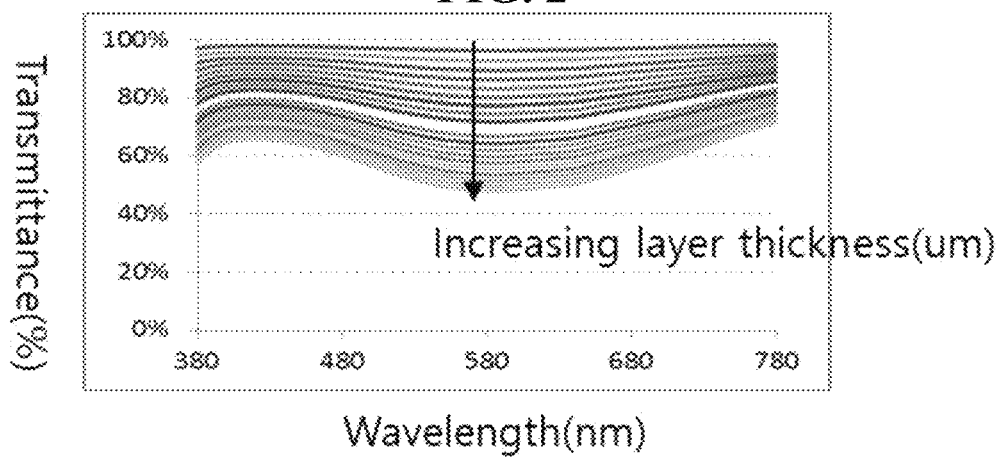
FIG. 2 is a graph showing a transmittance with respect to a wavelength and a thickness of a transmittance adjusting layer of an organic light emitting diode display device according to a first embodiment of the present disclosure.

FIGS. 1A and 1B are a plan view and an exploded perspective view, respectively, showing an organic light emitting diode display device according to a first embodiment of the present disclosure, and FIG. 2 is a graph showing a transmittance with respect to a wavelength and a thickness of a transmittance adjusting layer of an organic light emitting diode display device according to a first embodiment of the present disclosure.

In FIGS. 1A and 1B, an organic light emitting diode display device 100 includes a plurality of pixels P each including red, green and blue subpixels R-SP, G-SP and B-SP. Each of the red, green and blue subpixels R-SP, G-SP and B-SP includes an emission area EA, and a bank 119 (of FIG. 3) is disposed in an edge portion of the emission area EA to constitute a non-emission area NEA. In some embodiments, the non-emission area NEA may surround the emission area EA to include an upper portion, a right portion, a lower portion and a left portion.

The red, green and blue subpixels R-SP, G-SP and B-SP may be alternately disposed along a horizontal direction, and each of the red, green and blue subpixels R-SP, G-SP and B-SP may be disposed in a same line along a vertical direction.

As a result, the red, green and blue subpixels R-SP, G-SP and B-SP may be arranged to have a stripe type.

Each of the plurality of pixels P further includes a white subpixel W-SP, and the one pixel P including the white, red, green and blue subpixels W-SP, R-SP, G-SP and B-SP has a rectangular shape.

Although the white, red, green and blue subpixels W-SP, R-SP, G-SP and B-SP have a same width or substantially the same width as each other in the first embodiment, the white, red, green and blue subpixels W-SP, R-SP, G-SP and B-SP may have different widths from each other in another embodiment.

A switching thin film transistor (TFT) STr and a driving TFT DTr are disposed in the non-emission area NEA of each of the white, red, green and blue subpixels W-SP, R-SP, G-SP and B-SP, and a light emitting diode (LED) E (of FIG. 3) including a first electrode 111 (of FIG. 3), an emitting layer 113 (of FIG. 3) and a second electrode 115 (of FIG. 3) is disposed in the emission area EA of each of the white, red, green and blue subpixels W-SP, R-SP, G-SP and B-SP.

The switching TFT STr and the driving TFT DTr are connected to each other, and the driving TFT DTr is connected to the LED E.

A gate line GL, a data line DL, and a power line VDD are disposed on a substrate 101 to define each of the white, red, green and blue subpixels W-SP, R-SP, G-SP and B-SP.

The switching TFT STr is connected to the gate line GL and the data line DL crossing each other to select each of the white, red, green and blue subpixels W-SP, R-SP, G-SP and B-SP.

The switching TFT STr includes a switching gate electrode SG connected to the gate line GL, a switching semiconductor layer (not shown), a switching source electrode SS and a switching drain electrode SD.

The driving TFT DTr drives the LED E of each of the white, red, green and blue subpixels W-SP, R-SP, G-SP and B-SP selected by the switching TFT STr. The driving TFT DTr includes a driving gate electrode DG connected to the switching drain electrode SD of the switching TFT STr, a driving semiconductor layer 103 (of FIG. 3), a driving source electrode DS connected to the power line VDD and a driving drain electrode DD.

The driving drain electrode DD of the driving TFT DTr is connected to the first electrode 111 of the LED E.

The emitting layer 113 is disposed between the first and second electrodes 111 and 115 of the LED E.

In the OLED display device 100, a transmittance adjusting layer 200 including a gray dye is disposed to correspond to a transmitting direction of a light emitted from the emitting layer 113.

The transmittance adjusting layer 200 includes a gray pattern 210 and a transparent pattern 220 corresponding to the emission area EA and the non-emission area NEA in each of the white, red, green and blue subpixels W-SP, R-SP, G-SP and B-SP. The gray pattern 210 may be formed of a mixture of a transparent resin and a gray dye, and the transparent pattern 220 may be formed of a transparent resin.

The transparent resin may include a binder resin such as a polyester binder resin, acrylic binder resin, polyurethane binder resin, melamine binder resin, polyvinyl alcohol binder resin and oxazoline binder resin. For example, the transparent resin may include acrylic binder resin.

The transmittance adjusting layer 200 may be formed to change a transmittance of the OLED display device 100, and a transmittance of the transmittance adjusting layer 200 may be determined according to first and second thicknesses D1 and D2 (of FIG. 3) of the gray pattern 210.

In FIG. 2, the gray pattern 210 of the transmittance adjusting layer 200 may have various transmittances according to the first and second thicknesses D1 and D2.

The transmittance of the OLED display device 100 may be proportional to an external light reflectance. For example, the external light reflectance may increase as the transmittance increases, and the external light reflectance may decrease as the transmittance decreases.

Since the OLED display device 100 has various transmittances by using the transmittance adjusting layer 200, the OLED display device 100 may have various external light reflectances.

As a result, the OLED display device 100 without an additional circular polarizer may have various external light reflectances similar to, greater than or smaller than an external light reflectance of an OLED display device with a circular polarizer.

In the OLED display device 100, in some embodiments, only the gray pattern 210 of the transmittance adjusting layer 200 is disposed to correspond to the white subpixel W-SP and the non-emission area NEA of each of the red, green and blue subpixels R-SP, G-SP and B-SP, and the gray pattern 210 and the transparent pattern 220 overlapping each other are disposed to correspond to the emission area EA of each of the red, green and blue subpixels R-SP, G-SP and B-SP and the non-emission area NEA between the emission areas EA of the red, green and blue subpixels R-SP, G-SP and B-SP.

For example, only the gray pattern 210 may be disposed in the emission area EA of the white subpixel W-SP, the non-emission area NEA of the white subpixel W-SP and upper and lower portions of the non-emission area NEA of each of the red, green and blue subpixels R-SP, G-SP and B-SP. The gray pattern 210 and the transparent pattern 220 overlapping each other may be disposed in the emission area EA of each of the red, green and blue subpixels R-SP, G-SP and B-SP and left and right portions of the non-emission area NEA of each of the red, green and blue subpixels R-SP, G-SP and B-SP.

The transparent pattern 220 may be a monolithic single pattern covering the emission areas EA of each of the red, green and blue subpixels R-SP, G-SP and B-SP and the non-emission areas NEA between the emission areas EA of the red, green and blue subpixels R-SP, G-SP and B-SP.

As a result, the external light reflectance is reduced or minimized through adjustment of transmittance using the transmittance adjusting layer 200 even without a circular polarizer in the OLED display device 100.

Specifically, the transparent pattern 220 and the gray pattern 210 overlapping each other are disposed to correspond to the emission areas EA of each of the red, green and blue subpixels R-SP, G-SP and B-SP such that the transmittance adjusting layer 200 has a relatively high transmittance in the emission areas EA of each of the red, green and blue subpixels R-SP, G-SP and B-SP. As a result, reduction of luminance is prevented in the red, green and blue subpixels R-SP, G-SP and B-SP.

Since various luminances and various external light reflectances are designable, the OLED display device 100 having optimized luminance and external light reflectance is provided to enlarge application products and to satisfy customer needs.

In addition, since a circular polarizer of a relatively high cost is omitted, a material cost is reduced and a fabrication efficiency is improved.

Figure 3:
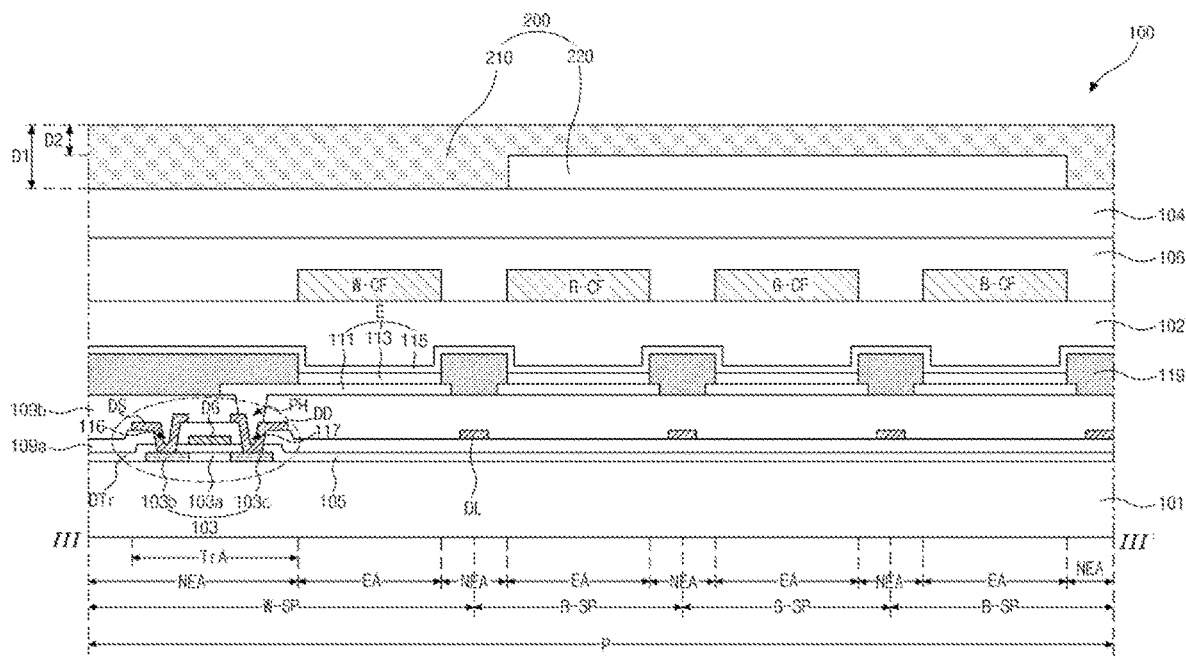
FIG. 3 is a cross-sectional view taken along a line of FIG. 1A.

FIG. 3 is a cross-sectional view taken along a line of FIG. 1A.

In FIG. 3, the pixel P includes the white, red, green and blue subpixels W-SP, R-SP, G-SP and B-SP. Each of the white, red, green and blue subpixels W-SP, R-SP, G-SP and B-SP includes the emission area EA, and the bank 119 is disposed in an edge portion of the emission area EA to constitute the non-emission area NEA.

The semiconductor layer 103 is disposed in a switching area TrA of the non-emission area NEA of each of the white, red, green and blue subpixels W-SP, R-SP, G-SP and B-SP on the substrate 101. The semiconductor layer 103 may be formed of silicon. For example, the semiconductor layer 103 may include an active region 103a of intrinsic silicon at a central portion thereof and source and drain regions 103b and 103c of impurity doped silicon at both sides of the active region 103a.

A gate insulating layer 105 is disposed on the semiconductor layer 103.

The driving gate electrode DG is disposed on the gate insulating layer 105 over the active region 103a of the semiconductor layer 103 and the gate line GL is disposed on the gate insulating layer 105.

A first interlayer insulating layer 109a is disposed on the driving gate electrode DG and the gate line GL. The first interlayer insulating layer 109a and the gate insulating layer 105 have first and second semiconductor contact holes 116 and 117 exposing the source and drain regions 103b and 103c, respectively.

The driving source and drain electrodes DS and DD are disposed on the first interlayer insulating layer 109a. The driving source and drain electrodes DS and DD are spaced apart from each other and are connected to the source and drain regions 103b and 103c through the first and second semiconductor contact holes 116 and 117, respectively.

A second interlayer insulating layer 109b is disposed on the driving source and drain electrodes DS and DD and the first interlayer insulating layer 109a exposed between the driving source and drain electrodes DS and DD.

The driving source and drain electrodes DS and DD, the semiconductor layer 103 including the source and drain regions 103b and 103c, the gate insulating layer 105 on the semiconductor layer 103 and the driving gate electrode DG constitute the driving TFT DTr.

The switching TFT STr has substantially the same structure as the driving TFT DTr and is connected to the driving TFT DTr.

Although the driving TFT DTr has a top gate type where the semiconductor layer 103 includes polycrystalline silicon or oxide semiconductor in the first embodiment, the driving TFT DTr may have a bottom gate type where the semiconductor layer includes intrinsic amorphous silicon and impurity doped amorphous silicon in another embodiment.

When the semiconductor layer 103 is formed of oxide semiconductor, a light shielding layer may be disposed under the semiconductor layer 103 and a buffer layer may be disposed between the light shielding layer and the semiconductor layer 103.

The second interlayer insulating layer 109b has a drain contact hole PH exposing the driving drain electrode DD of the driving TFT DTr.

The first electrode 111 is disposed on the second interlayer insulating layer 109b and is connected to the driving drain electrode DD of the driving TFT DTr through the drain contact hole PH. For example, the first electrode 111 may include a material having a relatively high work function to function as an anode.

The first electrode 111 is disposed in each of the white, red, green and blue subpixels W-SP, R-SP, G-SP and B-SP, and the bank 119 is disposed between the first electrodes 111 in the adjacent subpixels. The first electrode 111 is divided into each of the white, red, green and blue subpixels W-SP, R-SP, G-SP and B-SP with the bank 119 as a border of each subpixel.

The emitting layer 113 is disposed on the first electrode 111 inside the bank 119. The emitting layer 113 may have a single layer or a multiple layer including a hole injecting layer, a hole transporting layer, an emitting material layer, an electron transporting layer and an electron injecting layer.

The emitting layer 113 of each of the white, red, green and blue subpixels W-SP, R-SP, G-SP and B-SP may emit a white colored light.

The second electrode 115 is disposed on the emitting layer 113. For example, the second electrode 115 may include a material having a relatively low work function to function as a cathode.

When a voltage is applied to the first and second electrodes 111 and 115 according to a selected signal, a hole injected from the first electrode 111 and an electron injected from the second electrode 115 are transported into the emitting layer 113 to form an exciton. When the exciton transits from an excited state to a ground state, a light is generated in the emitting layer 113 to be emitted as a visible ray.

The OLED display device 100 has a top emission type, and the white colored light of the emitting layer 113 is emitted to an exterior through the second electrode 115. As a result, the OLED display device 100 displays an image.

Since the switching TFT STr and the driving TFT DTr are disposed under the bank 119 and the first electrode 111 in the top emission type, the top emission type has a wider design region as compared with a bottom emission type.

For example, the first electrode 111 of an anode may be formed of a metallic material having a relatively high reflectance and may have a single layer of aluminum (Al) or a double layer of aluminum (Al) and indium tin oxide (ITO). The second electrode 115 of a cathode may be formed of a transparent conductive material such as indium tin oxide (ITO) and indium zinc oxide (IZO) or a half transmissive metallic material such as magnesium (Mg), silver (Ag) and an alloy thereof to transmit the light of the emitting layer 113.

A passivation layer 102 and an encapsulating substrate 104 are sequentially disposed over the switching TFT STr, the driving TFT DTr and the LED E. The passivation layer 102 of a thin film prevents penetration of a moisture into the white, red, green and blue subpixels W-SP, R-SP, G-SP and B-SP to protect the emitting layer 113 from a moisture or an oxygen.

The passivation layer 102 protects the switching TFT STr, the driving TFT DTr and the LED E from an external impact and attaches the substrate 101 and the encapsulating substrate 104.

As a result, the OLED display device 100 is encapsulated.

A color converting layer 106 is disposed on an inner surface of the encapsulating substrate 104. The color converting layer 106 includes white, red, green and blue color filter patterns W-CF, R-CF, G-CF and B-CF corresponding to the white, red, green and blue subpixels W-SP, R-SP, G-SP and B-SP, respectively. The color converting layer 106 converts the white colored light of the emitting layer 113, and the white, red, green and blue color filter patterns W-CF, R-CF, G-CF and B-CF correspond to the emission areas EA of the white, red, green and blue subpixels W-SP, R-SP, G-SP and B-SP, respectively.

Accordingly, the white, red, green and blue subpixels W-SP, R-SP, G-SP and B-SP emit white, red, green and blue colored lights, respectively, and the OLED display device 100 displays a full color image of a high luminance.

The white color filter pattern W-CF may be omitted in the emission area EA of the white subpixel W-SP and the white colored light of the emitting layer 113 may intactly pass through the color converting layer 106.

The transmittance adjusting layer 200 is further disposed on an outer surface of the encapsulating substrate 104.

The transmittance of the light emitted from the OLED display device 100 may be controlled by adjusting the first and second thicknesses D1 and D2 of the gray pattern 210 of the transmittance adjusting layer 200. For example, the gray pattern 210 may have different thicknesses in the emission area EA and the non-emission area NEA of the white, red, green and blue subpixels W-SP, R-SP, G-SP and B-SP. As a result, reduction of the luminance of the white, red, green and blue subpixels W-SP, R-SP, G-SP and B-SP is reduced or minimized, and the external light reflectance is reduced to have a value smaller than a reference.

Table 1 illustrates an experimental result of measuring an external light reflectance of a non-emission area and an emission area of subpixels of an organic light emitting diode display device according to a comparison example.

TABLE 1

|  | external light reflectance |
|---|---|
| NEA(electrode portion) | 9.74% |
| EA of R-SP | 0.86% |
| EA of G-SP | 2.36% |
| EA of B-SP | 0.06% |
| EA of W-SP | 6.22% |
| total | 19.24% |

In Table 1, the external light reflectance of the emission area EA of the white subpixel and the non-emission area (electrode portion) NEA is higher than the external light reflectance of the emission area EA of the red, green and blue subpixels.

As a result, while the external light reflectance of the emission area EA of the red, green and blue subpixels R-SP, G-SP and B-SP slightly influences the external light reflectance of the OLED display device, the external light reflectance of the emission area EA of the white subpixel W-SP and the non-emission area NEA corresponding to an electrode portion significantly influences the external light reflectance of the OLED display device.

In the OLED display device 100 according to a first embodiment of the present disclosure, the gray pattern 210 of the transmittance adjusting layer 200 corresponding to the emission area EA of the white subpixel W-SP and the non-emission area NEA is formed to have a first thickness D1. As a result, the transmittance of the transmittance adjusting layer 200 is significantly reduced in the emission area EA of the white subpixel W-SP and the non-emission area NEA, and the external light reflectance of the emission area EA of the white subpixel W-SP and the non-emission area NEA is significantly reduced.

Accordingly, the total external light reflectance of the OLED display device 100 is reduced due to the gray pattern 210 of the first thickness D1.

The gray pattern 210 of the transmittance adjusting layer 200 corresponding to the emission area EA of each of the red, green and blue subpixels R-SP, G-SP and B-SP is formed to have a second thickness D2 smaller than the first thickness D1. As a result, the transmittance of the transmittance adjusting layer 200 is slightly reduced in the emission area EA of each of the red, green and blue subpixels R-SP, G-SP and B-SP, and the external light reflectance of the emission area EA of each of the red, green and blue subpixels R-SP, G-SP and B-SP is slightly reduced.

Since the luminance of the red, green and blue subpixels R-SP, G-SP and B-SP is not significantly reduced, reduction of the luminance of the OLED display device 100 is prevented.

A total transmittance of the gray pattern 210 of the transmittance adjusting layer 200 may be obtained from a unit transmittance and a thickness according to a following equation 1.

TOTAL TRANSMITTANCE=UNIT TRANSMITTANCE*THICKNESS [EQUATION 1]

Various total transmittances are obtained by changing the first and second thicknesses D1 and D2 of the gray pattern 210 of the transmittance adjusting layer 200.

In Table 1, when the external light reflectance of the non-emission area NEA is about 9.74%, the first thickness D1 of the gray pattern 210 in the non-emission area NEA may be determined based on '9.74%*A2,' where A is a transmittance of the gray pattern 210 of the transmittance adjusting layer 200. For example, when the gray pattern 210 is formed to have a thickness corresponding to a transmittance of about 50%, the reflectance in the non-emission area NEA may be designed as about 2.43%.

The first and second thicknesses D1 and D2 of the gray pattern 210 of the transmittance adjusting layer 200 may be determined according to the equation 1 such that the non-emission area NEA and the emission area EA of the white, red, green and blue subpixels W-SP, R-SP, G-SP and B-SP have a target transmittance.

For example, the gray pattern 210 of the transmittance adjusting layer 200 having the first thickness D1 may be formed to have a transmittance of about 50% and the gray pattern 210 of the transmittance adjusting layer 200 having the second thickness D2 may be formed to have a transmittance of about 70%.

Accordingly, in the OLED display device 100 according to the first embodiment of the present disclosure, the external light reflectance is reduced or minimized and reduction of the luminance of the red, green and blue subpixels R-SP, G-SP and B-SP is prevented.

In addition, the luminance increases. Further, a material cost is reduced and a fabrication efficiency is improved due to omission of a circular polarizer of a relatively high cost.

Specifically, an ideal white colored light is obtained even when an additional white color transfer (WCT) is not performed. As a result, increase of a power consumption in the blue subpixel B-SP and decrease of a lifetime of the LED E in the blue subpixel B-SP are prevented.

Since the transmitting adjusting layer 200 including a gray dye is disposed to correspond to a transmitting direction of a light emitted from the emitting layer 113, the external light reflectance is reduced or minimized and the luminance increases. As a result, an ideal white colored light is obtained even when an additional white color transfer (WCT) is not performed.

A chromaticity of a light source or a reference white color may be expressed as a temperature of a closest region in a radiation curve instead of a coordinate in a two dimensional color space. The temperature may be referred to as a correlated color temperature (CCT) or a color temperature. The color temperature may be used as a value expressing a degree where a white color is close to a color. For example, a CCT of about 10000K is beneficial.

Figure 4A:
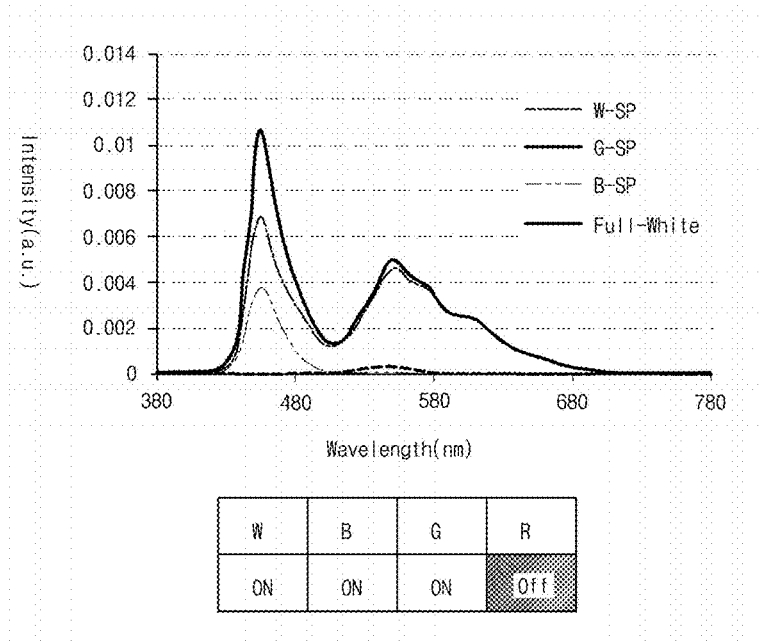
FIGS. 4A and 4B are graphs showing white color transfers of organic light emitting diode display devices according to a comparison example and a first embodiment of the present disclosure, respectively.
Figure 4B:
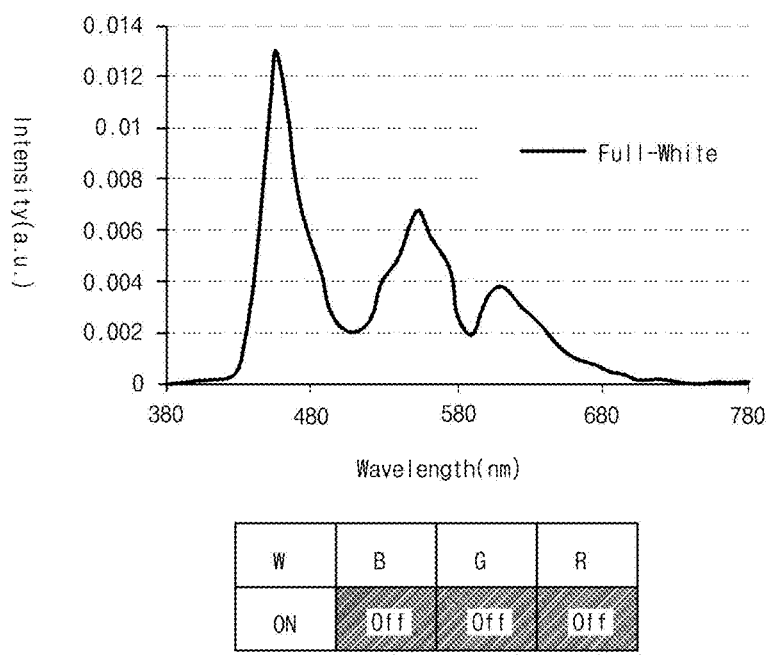

FIGS. 4A and 4B are graphs showing white color transfers of organic light emitting diode display devices according to a comparison example and a first embodiment of the present disclosure, respectively.

In FIG. 4A, since an OLED display device including a circular polarizer according to a comparison example has a relatively low luminance, a CCT of about 6500K is obtained through a WCT by using a white, blue and green subpixels W-SP, B-SP and G-SP.

For example, in the OLED display device including a circular polarizer according to a comparison example, a white color having the CCT of about 6500K is obtained by driving the white, blue and green subpixels W-SP, B-SP and G-SP simultaneously.

Since the blue subpixel B-SP has a lower efficiency as compared with the white and green subpixels W-SP and G-SP, a higher power consumption is beneficial for a WCT. As a result, a lifetime of an LED of the blue subpixel B-SP is shortened and the efficiency of the OLED display device is reduced.

In FIG. 4B, since the gray pattern 210 having the first thickness D1 is disposed to correspond to the white subpixel W-SP in the OLED display device 100 according to a first embodiment of the present disclosure, the luminance of the white subpixel W-SP increases as compared with the OLED display device including a circular polarizer even when the transmittance of the white subpixel W-SP is reduced to about 50%.

As a result, a white color having a CCT of about 10000K is obtained by driving the white subpixel W-SP.

Table 2 illustrates an experimental result of a color coordinate, external light reflectance and a total transmittance according to a unit transmittance of a transmittance adjusting layer 200 of an organic light emitting diode display device according to a comparison example and a first embodiment of the present disclosure.

embodiment of the present disclosure where the gray pattern 210 of the transmittance adjusting layer 200 corresponding to the emission area EA of the white subpixel W-SP and the non-emission area NEA has a transmittance of about 50%.

In the samples 2, 3, 4, 5 and 6, the gray pattern 210 corresponding to the emission area EA of the red, green and blue subpixels R-SP, G-SP and B-SP has a transmittance of about 70%.

A white color coordinate of (0.281, 0.288) is beneficial for a CCT of about 10000K. Since the OLED display device including a circular polarizer has a white color coordinate of (0.309, 0.328), a CCT of about 10000K is not obtained in the sample 1 of the OLED display device including a circular polarizer.

While the white color coordinate of (0.281, 0.288) corresponding to the CCT of about 10000K is not obtained in the samples 2, 3, 4 and 5 of the OLED display device, the white color coordinate of (0.284, 0.290) is obtained in the sample 6 of the OLED display device including the gray pattern 210 of the transmittance adjusting layer 200 having a transmittance of about 50%. The white color coordinate of the sample 6 is very close to the white color coordinate corresponding to the CCT of about 10000K.

Specifically, the sample 6 has an external light reflectance similar to the external light reflectance of the sample 1 of the OLED display device including a circular polarizer, and the sample 6 has a higher total transmittance by about 15% as compared with the sample 1 of the OLED display device including a circular polarizer.

TABLE 2

|  |  | sample 1 | sample 2 | sample 3 | sample 4 | sample 5 | sample 6 |
| --- | --- | --- | --- | --- | --- | --- | --- |
| unit transmittance |  | 45% | 90% | 80% | 70% | 60% | 50% |
| white color | Cx | 0.309 | 0.300 | 0.297 | 0.293 | 0.289 | 0.284 |
| coordinate | Cy | 0.328 | 0.314 | 0.310 | 0.304 | 0.298 | 0.290 |
| external light reflectance |  | 4.5% | 14.53% | 11.82% | 9.42% | 7.35% | 5.5% |
| total transmittance |  | 100% | 199% | 179% | 156% | 136% | 115% |

In Table 2, a sample 1 represents an OLED display device according to a comparison example and including a circular polarizer, and a sample 2 represents an OLED display device according to a first embodiment of the present disclosure where the gray pattern 210 of the transmittance adjusting layer 200 corresponding to the emission area EA of the white subpixel W-SP and the non-emission area NEA has a transmittance of about 90%.

A sample 3 represents an OLED display device according to a first embodiment of the present disclosure where the gray pattern 210 of the transmittance adjusting layer 200 corresponding to the emission area EA of the white subpixel W-SP and the non-emission area NEA has a transmittance of about 80%, and a sample 4 represents an OLED display device according to a first embodiment of the present disclosure where the gray pattern 210 of the transmittance adjusting layer 200 corresponding to the emission area EA of the white subpixel W-SP and the non-emission area NEA has a transmittance of about 70%. A sample 5 represents an OLED display device according to a first embodiment of the present disclosure where the gray pattern 210 of the transmittance adjusting layer 200 corresponding to the emission area EA of the white subpixel W-SP and the non-emission area NEA has a transmittance of about 60%, and a sample 6 represents an OLED display device according to a first In the OLED display device 100 according to a first embodiment of the present disclosure, the gray pattern 210 of the transmittance adjusting layer 200 corresponding to the emission area EA of the white subpixel W-SP and the non-emission area NEA has a transmittance of about 50%, and the gray pattern 210 of the transmittance adjusting layer 200 corresponding to the emission area EA of the red, green and blue subpixels R-SP, G-SP and B-SP has a transmittance of about 70%. As a result, the external light reflectance is reduced or minimized even without an additional circular polarizer and reduction of the luminance in the red, green and blue subpixels R-SP, G-SP and B-SP is prevented.

Further, since the luminance of the OLED display device 100 increases, an ideal white colored light is obtained even when an additional WCT is not performed.

Accordingly, increase of the power consumption of the blue subpixel B-SP and shortening of the lifetime of the LED in the blue subpixel B-SP are prevented.

In the OLED display device 100 according to a first embodiment of the present disclosure, the gray pattern 210 of the transmittance adjusting layer 200 corresponding to the emission area EA of the white subpixel W-SP and the non-emission area NEA has the first thickness D1 and the gray pattern 210 of the transmittance adjusting layer 200 corresponding to the emission area EA of each of the red, green and blue subpixels R-SP, G-SP and B-SP and the non-emission area NEA between the emission areas EA of the red, green and blue subpixels R-SP, G-SP and B-SP has the second thickness D2 smaller than the first thickness D1 such that the gray pattern 210 corresponding to the emission area EA of the white subpixel W-SP and the non-emission area NEA has a transmittance of about 50% and the gray pattern 210 corresponding to the emission area EA of each of the red, green and blue subpixels R-SP, G-SP and B-SP has a transmittance of about 70%. As a result, the gray pattern 210 of the transmittance adjusting layer 200 has a step difference.

To compensate the step difference of the gray pattern 210, the transparent pattern 220 may be disposed over or under the gray pattern 210 having the second thickness D2 to overlap the gray pattern 210 having the second thickness D2.

The transmittance adjusting layer 200 including the transparent pattern 220 may have a refractive index equal to or similar to the encapsulating substrate 104. As a result, when the light of the white, red, green and blue subpixels W-SP, R-SP, G-SP and B-SP passes through the encapsulating substrate 104 and enters the transmittance adjusting layer 200, refraction and loss of the light at an interface surface between the encapsulating substrate 104 and the transmittance adjusting layer 200 is prevented and increase of the external light reflectance is prevented.

Figure 5:
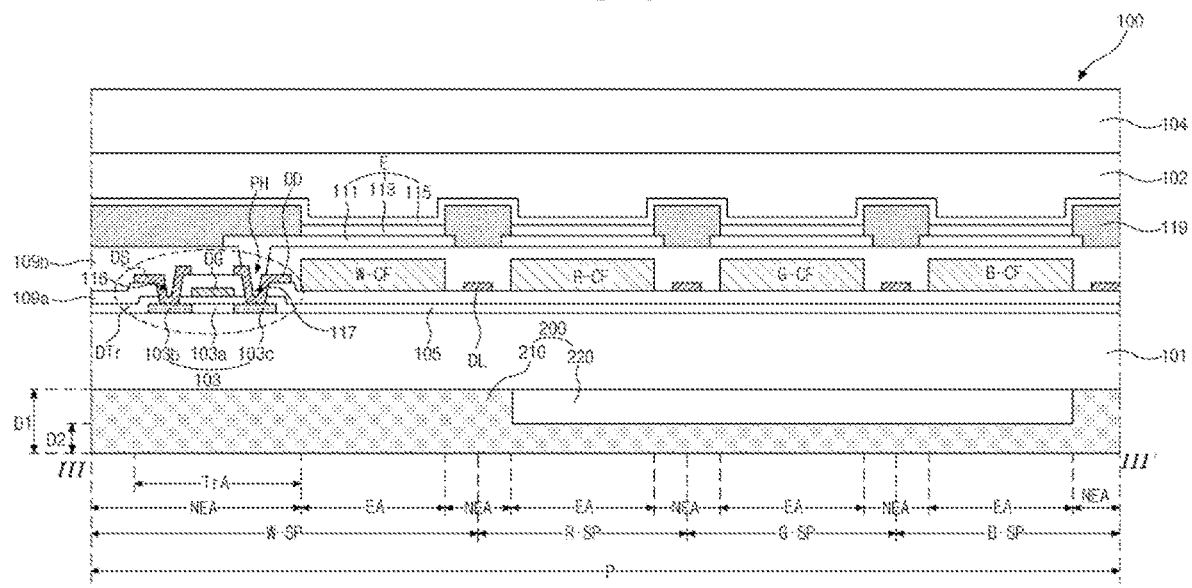
FIG. 5 is a cross-sectional view showing an organic light emitting diode display device according to a second embodiment of the present disclosure.

FIG. 5 is a cross-sectional view showing an organic light emitting diode display device according to a second embodiment of the present disclosure. The OLED display device according to the second embodiment has a bottom emission type.

In FIG. 5, a driving thin film transistor (TFT) DTr including a semiconductor layer 103, a gate insulating layer 105, a driving gate electrode DG, a driving source electrode DS and a driving drain electrode DD is disposed in a switching area TrA of a non-emission area NEA on a substrate 101. White, red, green and blue color filter patterns W-CF, R-CF, G-CF and B-CF are disposed in an emission area EA of white, red, green and blue subpixels W-SP, R-SP, G-SP and B-SP, respectively, on a first interlayer insulating layer 109a.

A second interlayer insulating layer 109b is disposed on the white, red, green and blue color filter patterns W-CF, R-CF, G-CF and B-CF, and a first electrode 111 is disposed on the second interlayer insulating layer 109b. The first electrode 111 is connected to the driving drain electrode DD through a drain contact hole PH in the gate insulating layer 105 and the first interlayer insulating layer 109a.

The first electrode 111 is disposed in each of the white, red, green and blue subpixels W-SP, R-SP, G-SP and B-SP, and a bank 119 is disposed between the first electrodes 111 of the adjacent subpixels.

An emitting layer 113 is disposed on the first electrode 111 inside the bank 119, and a second electrode 115 is disposed on the emitting layer 113. The first and second electrodes 111 and 115 may be an anode and a cathode, respectively, and the first electrode 111, the emitting layer 113 and the second electrode 115 may constitute a light emitting diode (LED) E.

A passivation layer 102 of a thin film and an encapsulating substrate 104 are sequentially disposed over the driving TFT DTr and the LED E such that the OLED display device 100 is encapsulated.

In the OLED display device 100 of the bottom emission type according to the second embodiment of the present disclosure, a white colored light emitted from the emitting layer 113 passes through the first electrode 111 and the white, red, green and blue color filter patterns W-CF, R-CF, G-CF and B-CF to display an image.

A transmittance adjusting layer 200 including a gray dye is disposed to correspond to a transmitting direction of a light emitted from the emitting layer 113. In the OLED display device 100, in some embodiments, only a gray pattern 210 of the transmittance adjusting layer 200 is disposed to correspond to the white subpixel W-SP and the non-emission area NEA of each of the red, green and blue subpixels R-SP, G-SP and B-SP, and the gray pattern 210 and a transparent pattern 220 overlapping each other are disposed to correspond to the emission area EA of each of the red, green and blue subpixels R-SP, G-SP and B-SP and the non-emission area NEA between the emission areas EA of the red, green and blue subpixels R-SP, G-SP and B-SP.

In the OLED display device 100 according to a second embodiment of the present disclosure, the gray pattern 210 of the transmittance adjusting layer 200 corresponding to the emission area EA of the white subpixel W-SP and the non-emission area NEA has a transmittance of about 50%, and the gray pattern 210 of the transmittance adjusting layer 200 corresponding to the emission area EA of the red, green and blue subpixels R-SP, G-SP and B-SP has a transmittance of about 70%. As a result, the external light reflectance is reduced or minimized even without an additional circular polarizer and reduction of the luminance in the red, green and blue subpixels R-SP, G-SP and B-SP is prevented.

Further, since the luminance of the OLED display device 100 increases, an ideal white colored light is obtained even when an additional WCT is not performed.

Accordingly, increase of the power consumption of the blue subpixel B-SP and shortening of the lifetime of the LED in the blue subpixel B-SP are prevented.

Figure 6:
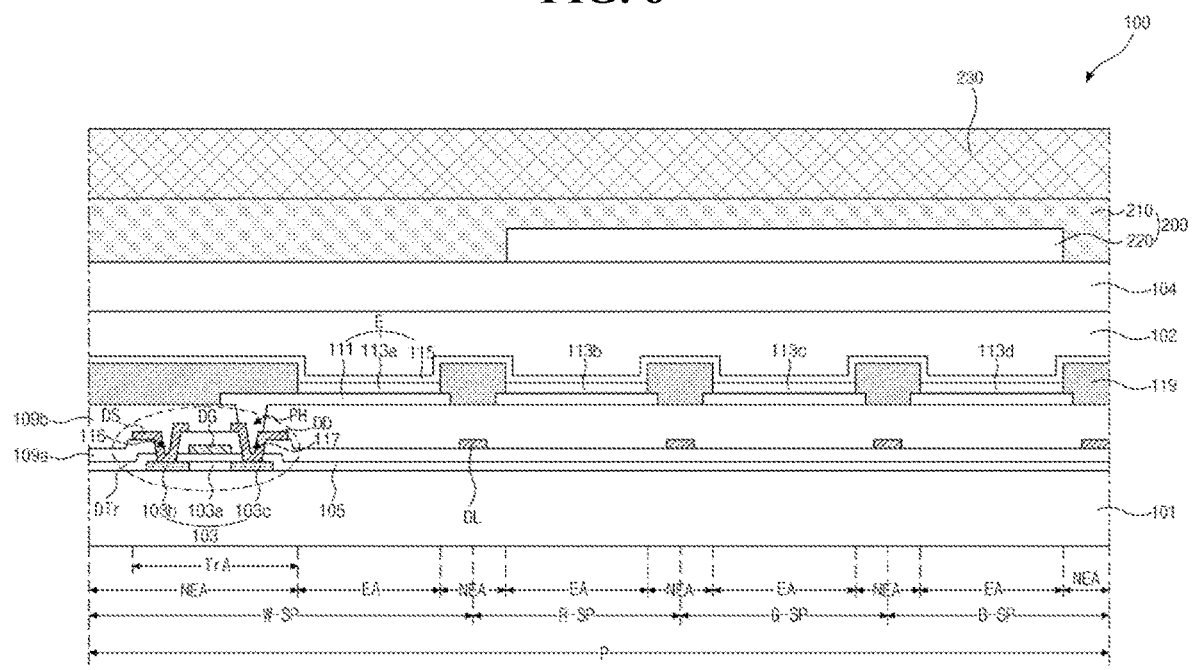
FIG. 6 is a cross-sectional view showing an organic light emitting diode display device according to a third embodiment of the present disclosure.

FIG. 6 is a cross-sectional view showing an organic light emitting diode display device according to a third embodiment of the present disclosure.

In FIG. 6, a driving thin film transistor (TFT) DTr including a semiconductor layer 103, a gate insulating layer 105, a driving gate electrode DG, a driving source electrode DS and a driving drain electrode DD is disposed in a switching area TrA of a non-emission area NEA on a substrate 101. A first electrode 111 is disposed in an emission area EA on a second interlayer insulating layer 109b. The first electrode 111 is connected to the driving drain electrode DD through a drain contact hole PH in the gate insulating layer 105 and a first interlayer insulating layer 109a.

The first electrode 111 is disposed in each of white, red, green and blue subpixels W-SP, R-SP, G-SP and B-SP, and a bank 119 is disposed between the first electrodes 111 of the adjacent subpixels.

White, red, green and blue emitting layers 113a, 113b, 113c and 113d are disposed on the first electrode 111 inside the bank 119 in white, red, green and blue subpixels W-SP, R-SP, G-SP and B-SP, respectively, and a second electrode 115 is disposed on the white, red, green and blue emitting layers 113a, 113b, 113c and 113d. The white, red, green and blue emitting layers 113a, 113b, 113c and 113d emit white, red, green and blue colored lights, respectively. The first and second electrodes 111 and 115 may be an anode and a cathode, respectively, and the first electrode 111, each of the white, red, green and blue emitting layers 113a, 113b, 113c and 113d and the second electrode 115 may constitute a light emitting diode (LED) E.

A passivation layer 102 of a thin film and an encapsulating substrate 104 are sequentially disposed over the driving TFT DTr and the LED E such that the OLED display device 100 is encapsulated.

A transmittance adjusting layer 200 is disposed to correspond to a transmitting direction of a light emitted from the white, red, green and blue emitting layers 113a, 113b, 113c and 113d. In the OLED display device 100, in some embodiments, only a gray pattern 210 of the transmittance adjusting layer 200 is disposed to correspond to the white subpixel W-SP and the non-emission area NEA of each of the red, green and blue subpixels R-SP, G-SP and B-SP, and the gray pattern 210 and a transparent pattern 220 overlapping each other are disposed to correspond to the emission area EA of each of the red, green and blue subpixels R-SP, G-SP and B-SP and the non-emission area NEA between the emission areas EA of the red, green and blue subpixels R-SP, G-SP and B-SP.

Specifically, a brightness enhancement film 230 may be disposed on the transmittance adjusting layer 200.

As a result, the OLED display device 100 according to a third embodiment of the present disclosure has an external light reflectance substantially the same as an external light reflectance of an OLED display device having a circular polarizer and has a luminance greater than a luminance of an OLED display device having a circular polarizer by about 30%.

Table 3 illustrates an experimental result of a color coordinate, a luminance and an external light reflectance according to a transmittance of an organic light emitting diode display device according to a comparison example and a third embodiment of the present disclosure.

TABLE 3

| | | sample A | sample B |
|---|---|---|---|
| transmittance | EA of R-SP, G-SP, B-SP (including NEA betweenEA of R-SP, G-SP, B-SP) | 38% | 70% |
| | W-SP, NEA of R-SP, G-SP, B-SP | | 50% |
| white color coordinate(Cx, Cy) | | 0.295, 0.316 | 0.282, 0.288 |
| full white luminance | | 100% | 135% |
| red, green, blue luminances | | 100% | 138% |
| external light reflectance | | 4.5% | 4.0% AR 0.8% |

In Table 3, a sample A represents an OLED display device according to a comparison example and including a brightness enhancement film. The sample A does not satisfy a white color coordinate of (0.281, 0.288) corresponding to a CCT of 10000K.

A sample B represents an OLED display device 100 according to a third embodiment of the present disclosure where the gray pattern 210 of the transmittance adjusting layer 200 corresponding to the emission area EA of the white subpixel W-SP and the non-emission area NEA has a transmittance of about 50%, and the gray pattern 210 of the transmittance adjusting layer 200 corresponding to the emission area EA of each of the red, green and blue subpixels R-SP, G-SP and B-SP has a transmittance of about 70%. In the OLED display device 100 of the sample B, a brightness enhancement film is further disposed on the transmittance adjusting layer. As a result, the external light reflectance of about 4.0% and a white color coordinate of (0.282, 0.288) corresponding to a CCT of 10000K are obtained.

Specifically, when a full white luminance of the OLED display device of the sample A is about 100%, a full white luminance of the OLED display device 100 of the sample B is about 135%. As a result, the full white luminance increases by about 35% and red, green and blue luminances increase by about 38%.

In the OLED display device 100 according to a third embodiment of the present disclosure, the gray pattern 210 of the transmittance adjusting layer 200 corresponding to the emission area EA of the white subpixel W-SP and the non-emission area NEA has a transmittance of about 50%, and the gray pattern 210 of the transmittance adjusting layer 200 corresponding to the emission area EA of the red, green and blue subpixels R-SP, G-SP and B-SP has a transmittance of about 70%. As a result, the external light reflectance is reduced or minimized even without an additional circular polarizer and reduction of the luminance in the red, green and blue subpixels R-SP, G-SP and B-SP is prevented.

Further, since the luminance of the OLED display device 100 increases, an ideal white colored light is obtained even when an additional WCT is not performed.

Specifically, since various luminances and various external light reflectances are designable, the OLED display device 100 having optimized luminance and external light reflectance is provided to enlarge application products and to satisfy customer needs. In addition, since a circular polarizer of a relatively high cost is omitted, a material cost is reduced and a fabrication efficiency is improved.

Figure 7:
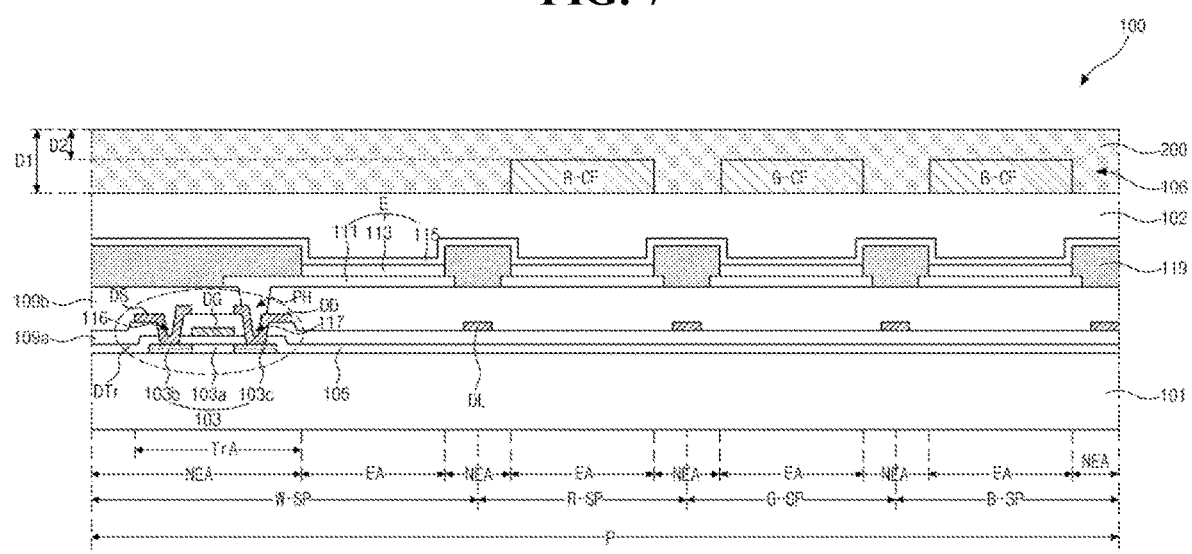
FIG. 7 is a cross-sectional view showing an organic light emitting diode display device according to a fourth embodiment of the present disclosure.

FIG. 7 is a cross-sectional view showing an organic light emitting diode display device according to a fourth embodiment of the present disclosure.

In FIG. 7, a driving thin film transistor (TFT) DTr including a semiconductor layer 103, a gate insulating layer 105, a driving gate electrode DG, a driving source electrode DS and a driving drain electrode DD is disposed in a switching area TrA of a non-emission area NEA on a substrate 101. A first electrode 111 is disposed in an emission area EA on a second interlayer insulating layer 109b. The first electrode 111 is connected to the driving drain electrode DD through a drain contact hole PH in the gate insulating layer 105 and a first interlayer insulating layer 109a.

The first electrode 111 is disposed in each of white, red, green and blue subpixels W-SP, R-SP, G-SP and B-SP, and a bank 119 is disposed between the first electrodes 111 of the adjacent subpixels.

An emitting layer 113 is disposed on the first electrode 111 inside the bank 119 in each of white, red, green and blue subpixels W-SP, R-SP, G-SP and B-SP, and a second electrode 115 is disposed on the emitting layer 113. The emitting layer 113 emits a white colored light. The first and second electrodes 111 and 115 may be an anode and a cathode, respectively, and the first electrode 111, the emitting layer 113 and the second electrode 115 may constitute a light emitting diode (LED) E.

A passivation layer 102 of a thin film and a color converting layer 106 are sequentially disposed over the driving TFT DTr and the LED E.

The color converting layer 106 includes red, green and blue color filter patterns R-CF, G-CF and B-CF corresponding to the red, green and blue subpixels R-SP, G-SP and B-SP, respectively. The red, green and blue color filter patterns R-CF, G-CF and B-CF are disposed to correspond to the emission areas EA of the red, green and blue subpixels R-SP, G-SP and B-SP, respectively.

A transmittance adjusting layer 200 is disposed to cover the red, green and blue color filter patterns R-CF, G-CF and B-CF of the color converting layer 106. The transmittance adjusting layer 200 completely covers the red, green and blue color filter patterns R-CF, G-CF and B-CF in the red, green and blue subpixels R-SP, G-SP and B-SP and is disposed on the passivation layer 102 to wrap an upper surface and a side surface of the red, green and blue color filter patterns R-CF, G-CF and B-CF.

As a result, the transmittance adjusting layer 200 corresponding to the white subpixel W-SP and the non-emission area NEA of each of the red, green and blue subpixels R-SP, G-SP and B-SP has a first thickness D1, and the transmittance adjusting layer 200 corresponding to the emission area EA of each of the red, green and blue subpixels R-SP, G-SP and B-SP has a second thickness D2 smaller than the first thickness D1.

Since the first thickness D1 corresponds to a sum of a thickness of each of the red, green and blue color filter patterns R-CF, G-CF and B-CF and the second thickness D2, the transmittance adjusting layer 200 covering the red, green and blue color filter patterns R-CF, G-CF and B-CF has a flat upper surface.

The transmittance adjusting layer 200 may be formed of a mixture of a transparent resin and a gray dye. The transparent resin may include an acrylic resin or an epoxy resin having an excellent insulation property and not reacting with an external material. For example, the transparent resin may include a photoacryl (PAC).

The transmittance adjusting layer 200 including a photoacryl may outgas the red, green and blue color filter patterns R-CF, G-CF and B-CF and may block a moisture. In addition, the transmittance adjusting layer 200 including a photoacryl may compensate a step difference of the red, green and blue color filter patterns R-CF, G-CF and B-CF to planarize a surface of the OLED display device 100.

Specifically, since the transmittance adjusting layer 200 includes a gray dye, the OLED display device 100 has various transmittances. Since the transmittance adjusting layer 200 corresponding to the white subpixel W-SP and the non-emission area NEA of each of the red, green and blue subpixels R-SP, G-SP and B-SP has the first thickness D1 and the transmittance adjusting layer 200 corresponding to the emission area EA of each of the red, green and blue subpixels R-SP, G-SP and B-SP has the second thickness D2, the OLED display device 100 corresponding to the white subpixel W-SP and the non-emission area NEA of each of the red, green and blue subpixels R-SP, G-SP and B-SP has a relatively low transmittance and the OLED display device 100 corresponding to the emission area EA of each of the red, green and blue subpixels R-SP, G-SP and B-SP has a relatively high transmittance.

In the OLED display device 100 according to a fourth embodiment of the present disclosure, the transmittance adjusting layer 200 corresponding to the emission area EA of the white subpixel W-SP and the non-emission area NEA has a transmittance of about 50%, and the transmittance adjusting layer 200 corresponding to the emission area EA of each of the red, green and blue subpixels R-SP, G-SP and B-SP has a transmittance of about 70%. As a result, the external light reflectance is reduced or minimized to about 6% and a CCT of about 10000K is obtained.

Accordingly, since the external light reflectance is reduced or minimized and the luminance of the red, green and blue subpixels R-SP, G-SP and B-SP increases, an OLED display device having a relatively low reflectance and a relatively high luminance is provided.

A lifetime and an efficiency are improved and a power consumption is reduced.

Further, since various luminances and various external light reflectances are designable, the OLED display device 100 having optimized luminance and external light reflectance is provided to enlarge application products and to satisfy customer needs. In addition, since a circular polarizer of a relatively high cost is omitted, a material cost is reduced and a fabrication efficiency is improved.

Specifically, since an additional planarization process and an encapsulating substrate are omitted in the OLED display device 100 including the red, green and blue color filter patterns R-CF, G-CF and B-CF, a fabrication efficiency is further improved.

It will be apparent to those skilled in the art that various modifications and variation can be made in the present disclosure without departing from the spirit or scope of the disclosure. Thus, it is intended that the present disclosure cover the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode display device, comprising:
   a substrate including first, second, third, and fourth subpixels each having an emission area and a non-emission area, the non-emission areas disposed between the emission areas of adjacent two of the first, second, third and fourth subpixels;
   first, second, third, and fourth light emitting diodes in the first, second, third, and fourth subpixels, respectively, on the substrate; and
   a transmittance adjusting layer receiving a light emitted from the first, second, third, and fourth light emitting diodes and including a gray dye,
   wherein the first subpixel includes a white subpixel,
   wherein the transmittance adjusting layer includes a gray pattern including the gray dye and a transparent pattern,
   wherein, in a cross-sectional view, a first portion of the gray pattern overlaps the first light emitting diode in a direction perpendicular to the substrate and has a first transmittance, and a second portion of the gray pattern overlaps each of the second, third and fourth light emitting diodes in the direction perpendicular to the substrate and has a second transmittance higher than the first transmittance,
   wherein, in the cross-sectional view, the transparent pattern overlaps each of the second, third and fourth light emitting diodes in the direction perpendicular to the substrate, and does not overlap the first light emitting diode in the direction perpendicular to the substrate, and
   wherein, a color filter pattern is disposed between the transmittance adjusting layer and each of the first, second, third and fourth light emitting diodes.

2. The organic light emitting diode display device of claim 1, wherein the first portion of the gray pattern having the first transmittance has a first thickness and the second portion of the gray pattern having the second transmittance has a second thickness smaller than the first thickness.

3. The organic light emitting diode display device of claim 2, wherein the second portion of the gray pattern having the second transmittance overlaps the transparent pattern.

4. The organic light emitting diode display device of claim 2, wherein a third portion of the gray pattern corresponding to the non-emission areas between the emission areas of adjacent subpixels of the second, third and fourth subpixels has the second thickness.

5. The organic light emitting diode display device of claim 3, wherein an encapsulating substrate is disposed between the first, second, third, and fourth light emitting diodes and the transmittance adjusting layer, and wherein the encapsulating substrate has a same refractive index as the transparent pattern.

6. The organic light emitting diode display device of claim 3, wherein the transparent pattern is a monolithic single pattern and is between the second portion of the gray pattern and each of the second, third and fourth light emitting diodes.

7. The organic light emitting diode display device of claim 1, wherein the light emitted from the first, second, third, and fourth light emitting diodes has a white color, and wherein the color filter pattern comprises a red color filter pattern disposed between the transmittance adjusting layer and the second light emitting diode in the emission area of the second subpixel, a green color filter pattern disposed between the transmittance adjusting layer and the third light emitting diode in the emission area of the third subpixel, and a blue color filter pattern disposed between the transmittance adjusting layer and the fourth light emitting diode in the emission area of the fourth subpixel.

8. The organic light emitting diode display device of claim 7, wherein the color filter pattern further comprises a white color filter pattern disposed between the transmittance adjusting layer and the first light emitting diode in the emission area of the first subpixel.

9. The organic light emitting diode display device of claim 8, wherein the transparent pattern is disposed between each of the white, red, green and blue color filter patterns and the gray pattern.

10. The organic light emitting diode display device of claim 1, wherein the first, second, third, and fourth light emitting diodes are disposed on a first surface of the substrate, and the transmittance adjusting layer is disposed on a second surface of the substrate.

* * * * *